United States Patent
Han et al.

(10) Patent No.: US 8,796,626 B2
(45) Date of Patent: Aug. 5, 2014

(54) OPTICAL SENSOR

(75) Inventors: Kun-Wook Han, Seongnam-si (KR);
Sung-Ryul Kim, Asan-si (KR);
Woong-Kwon Kim, Cheonan-si (KR);
Dae-Cheol Kim, Hwaseong-si (KR);
Ki-Hun Jeong, Cheongan-si (KR);
Jung-Suk Bang, Guri-si (KR);
Yun-Jong Yeo, Seoul (KR);
Byeong-Hoon Cho, Seoul (KR);
Hong-Kee Chin, Suwon-si (KR);
Sung-Jin Mun, Busan (KR)

(73) Assignee: Samsung Display Co., Ltd., Yongin (KR)

( * ) Notice: Subject to any disclaimer, the term of this patent is extended or adjusted under 35 U.S.C. 154(b) by 555 days.

(21) Appl. No.: 13/194,365

(22) Filed: Jul. 29, 2011

(65) Prior Publication Data

US 2012/0228505 A1    Sep. 13, 2012

(30) Foreign Application Priority Data

Mar. 9, 2011    (KR) .................. 10-2011-0020796

(51) Int. Cl.
*H01L 27/14* (2006.01)

(52) U.S. Cl.
USPC ............... 250/339.05; 250/208.1; 250/338.4; 250/338.1; 250/339.01; 250/330; 250/331; 250/332

(58) Field of Classification Search
CPC ......... H04N 5/33; G01N 21/3563; G01J 3/02; G01J 5/20
USPC ............. 250/338.4, 208.1, 338.1, 339.02, 250/339.05, 330, 331, 332
See application file for complete search history.

(56) References Cited

U.S. PATENT DOCUMENTS

| | | | | |
|---|---|---|---|---|
| 4,996,413 A * | 2/1991 | McDaniel et al. | ......... | 250/208.1 |
| 5,331,179 A * | 7/1994 | Lee et al. | ....... | 250/591 |
| 5,381,014 A * | 1/1995 | Jeromin et al. | ......... | 250/370.09 |
| 5,589,961 A * | 12/1996 | Shigeta et al. | ................. | 349/41 |
| 5,892,222 A * | 4/1999 | Elabd | ............. | 250/226 |
| 5,926,238 A * | 7/1999 | Inoue et al. | ..................... | 349/61 |
| 6,107,618 A * | 8/2000 | Fossum et al. | ............. | 250/208.1 |
| 6,150,930 A * | 11/2000 | Cooper | ........................ | 340/435 |
| 6,242,729 B1 * | 6/2001 | Izumi et al. | ................ | 250/208.1 |
| 6,404,852 B1 * | 6/2002 | Petrick et al. | ................. | 378/98.8 |
| 6,437,767 B1 * | 8/2002 | Cairns et al. | .................. | 345/100 |
| 6,515,275 B1 * | 2/2003 | Hunter et al. | ................ | 250/226 |
| 6,593,577 B2 * | 7/2003 | Izumi | ...................... | 250/370.09 |
| 6,606,120 B1 * | 8/2003 | Merrill et al. | ................. | 348/273 |
| 6,930,310 B2 * | 8/2005 | Moon | ...................... | 250/370.09 |
| 6,998,660 B2 * | 2/2006 | Lyon et al. | .................... | 257/294 |
| 7,075,079 B2 * | 7/2006 | Wood | ............................ | 250/332 |
| 7,154,157 B2 * | 12/2006 | Bradski et al. | ................ | 257/440 |
| 7,199,348 B2 * | 4/2007 | Olsen et al. | ................ | 250/208.1 |
| 7,274,393 B2 * | 9/2007 | Acharya | ....................... | 348/273 |

(Continued)

*Primary Examiner* — David Porta
*Assistant Examiner* — Djura Malevic
(74) *Attorney, Agent, or Firm* — H.C. Park & Associates, PLC

(57) ABSTRACT

An optical sensor includes a visible light sensor includes a visible light sensing transistor and an infrared light sensor includes an infrared light sensing transistor, wherein the visible light sensing transistor receives a first driving voltage through a first driving voltage line, the infrared light sensing transistor receives a second driving voltage through a second driving voltage line, and the visible light sensing transistor and the infrared light sensing transistor receive a reference voltage through a reference voltage line.

21 Claims, 9 Drawing Sheets

(56) References Cited

U.S. PATENT DOCUMENTS

| | | | |
|---|---|---|---|
| 7,388,184 B2 * | 6/2008 | Izumi et al. | 250/208.1 |
| 7,435,968 B2 * | 10/2008 | Watanabe et al. | 250/370.14 |
| 7,456,812 B2 * | 11/2008 | Smith et al. | 345/82 |
| 7,488,944 B2 * | 2/2009 | Okada | 250/370.08 |
| 7,705,308 B2 * | 4/2010 | Suzuki | 250/338.1 |
| 7,723,667 B2 * | 5/2010 | Shannon et al. | 250/214.1 |
| 7,773,139 B2 * | 8/2010 | den Boer et al. | 348/302 |
| 7,782,517 B2 * | 8/2010 | Griffiths et al. | 359/237 |
| 7,940,252 B2 * | 5/2011 | Chuang et al. | 345/175 |
| 8,169,518 B2 * | 5/2012 | Ota | 348/294 |
| 8,289,429 B2 * | 10/2012 | den Boer et al. | 348/302 |
| 8,395,686 B2 * | 3/2013 | Tatani et al. | 348/302 |
| 8,436,308 B2 * | 5/2013 | Choe et al. | 250/339.05 |
| 8,466,902 B2 * | 6/2013 | Boer et al. | 345/175 |
| 8,483,359 B2 * | 7/2013 | Fujita et al. | 378/98.8 |
| 8,659,583 B2 * | 2/2014 | Cho | 345/204 |
| 2001/0033336 A1 * | 10/2001 | Kameshima et al. | 348/300 |
| 2001/0048106 A1 * | 12/2001 | Tanada | 257/66 |
| 2001/0052597 A1 * | 12/2001 | Young et al. | 257/59 |
| 2001/0055008 A1 * | 12/2001 | Young et al. | 345/204 |
| 2002/0030768 A1 * | 3/2002 | Wu | 349/42 |
| 2003/0179323 A1 * | 9/2003 | Abileah et al. | 349/24 |
| 2003/0205662 A1 * | 11/2003 | Boer | 250/208.1 |
| 2003/0218116 A1 * | 11/2003 | Boer | 250/208.1 |
| 2004/0046900 A1 * | 3/2004 | Boer et al. | 349/43 |
| 2005/0029456 A1 * | 2/2005 | Eggers et al. | 250/339.02 |
| 2005/0045804 A1 * | 3/2005 | Park et al. | 250/208.1 |
| 2006/0170658 A1 * | 8/2006 | Nakamura et al. | 345/173 |
| 2006/0186322 A1 * | 8/2006 | Matsuyama | 250/226 |
| 2006/0249763 A1 * | 11/2006 | Mochizuki et al. | 257/291 |
| 2007/0001945 A1 * | 1/2007 | Yoshida et al. | 345/87 |
| 2007/0109239 A1 * | 5/2007 | den Boer et al. | 345/87 |
| 2007/0128583 A1 * | 6/2007 | Miyazawa | 434/433 |
| 2007/0201738 A1 * | 8/2007 | Toda et al. | 382/144 |
| 2007/0257256 A1 * | 11/2007 | Kugler | 257/40 |
| 2007/0273781 A1 * | 11/2007 | Choe et al. | 348/311 |
| 2007/0279346 A1 * | 12/2007 | den Boer et al. | 345/84 |
| 2008/0066972 A1 * | 3/2008 | Abileah et al. | 178/18.09 |
| 2008/0074401 A1 * | 3/2008 | Chung et al. | 345/175 |
| 2008/0084374 A1 * | 4/2008 | Abileah et al. | 345/87 |
| 2008/0087800 A1 * | 4/2008 | Toda | 250/214 C |
| 2008/0252618 A1 * | 10/2008 | Chung et al. | 345/175 |
| 2008/0284925 A1 * | 11/2008 | Han | 349/12 |
| 2009/0101900 A1 * | 4/2009 | Chuang et al. | 257/59 |
| 2009/0206237 A1 * | 8/2009 | Shannon et al. | 250/214 AL |
| 2009/0278777 A1 * | 11/2009 | Wang et al. | 345/89 |
| 2010/0013796 A1 * | 1/2010 | Abileah et al. | 345/175 |
| 2010/0013864 A1 * | 1/2010 | Oelhafen et al. | 345/690 |
| 2010/0177060 A1 * | 7/2010 | Han | 345/174 |
| 2010/0207879 A1 * | 8/2010 | Fadell et al. | 345/156 |
| 2011/0031399 A1 * | 2/2011 | So | 250/330 |
| 2011/0127410 A1 * | 6/2011 | Tanaka et al. | 250/208.2 |
| 2011/0148835 A1 * | 6/2011 | Yamazaki | 345/207 |

* cited by examiner

OPTICAL SENSOR

CROSS-REFERENCE TO RELATED APPLICATION

This application claims priority to and the benefit of Korean Patent Application No. 10-2011-0020796 filed on Mar. 9, 2011, which is hereby incorporated by reference for all purposes as if fully set forth herein.

BACKGROUND OF THE INVENTION

1. Field

An optical sensor is provided.

2. Discussion of the Background

Flat panel displays such as a liquid crystal display (LCD), an organic light emitting diode (OLED) display, and an electrophoretic display include plural pairs of field generating electrodes and an electro-optical active layer interposed therebetween. The liquid crystal display includes a liquid crystal layer as the electro-optical active layer and the organic light emitting diode display includes an organic emission layer as the electro-optical active layer. One of the field generating electrodes constituting one pair is generally connected to a switching element to receive an electrical signal and the electro-optical active layer converts the electrical signal into an optical signal to display an image.

In recent years, the display may include a touch sensing function which can interact with a user in addition to the function of displaying the image. In the touch sensing function, when a user writes characters or draw figures by touching a screen with a tool such as a finger or a touch pen, the display senses changes such as pressure or light applied to the screen to find whether there is a touch in the screen and information about a touch position. For example, in order to implement the touch sensing function, an infrared light sensing transistor may be used.

The display may also include an image sensing function. The image sensing function is to recognize images such as photographs and bar codes. For example, in order to implement the image sensing function, a visible light sensing transistor may be used.

SUMMARY OF THE INVENTION

Exemplary embodiments provide an optical sensor that includes a visible light sensor and an infrared light sensor.

Additional features of the invention will be set forth in the description which follows, and in part will be apparent from the description, or may be learned by practice of the invention.

In an exemplary embodiment, an optical sensor including: a visible light sensor including a visible light sensing transistor; and an infrared light sensor including an infrared light sensing transistor, wherein the visible light sensing transistor is configured to receive a first driving voltage through a first driving voltage line, the infrared light sensing transistor is configured to receive a second driving voltage through a second driving voltage line, and the visible light sensing transistor and the infrared light sensing transistor are both configured to receive a reference voltage through a reference voltage line.

In an exemplary embodiment, an optical sensor including: a visible light sensor including a visible light sensing transistor; and an infrared light sensor including an infrared light sensing transistor, wherein the visible light sensing transistor and the infrared light sensing transistor are both configured to receive driving voltages through a driving voltage line, the visible light sensing transistor receives a first reference voltage through a first reference voltage line, and the infrared light sensing transistor receives a second reference voltage through a second reference voltage line.

In an exemplary embodiment, an optical sensor including: a plurality of visible light sensors each including a plurality of visible light sensing transistor; and a plurality of infrared light sensors each including a plurality of infrared light sensing transistors, wherein the plurality of visible light sensing transistors and the plurality of infrared light sensing transistors are configured to receive driving voltages through a driving voltage line, the plurality of visible light sensing transistors are configured to receive a first reference voltage through a first reference voltage line, and the plurality of infrared light sensing transistors are configured to receive a second reference voltage through a second reference voltage line, wherein the plurality of visible light sensing sensor are arranged such that each individual visible light sensing sensor may be electrically isolated from the first reference voltage line such that the remaining visible light sensing sensors remain electrically connected to the first reference voltage line, and wherein the plurality of infrared light sensing sensors are arranged such that each individual infrared light sensing sensor may be electrically isolated from the second reference voltage line such that the remaining infrared light sensing sensors remain electrically connected to the second reference voltage line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
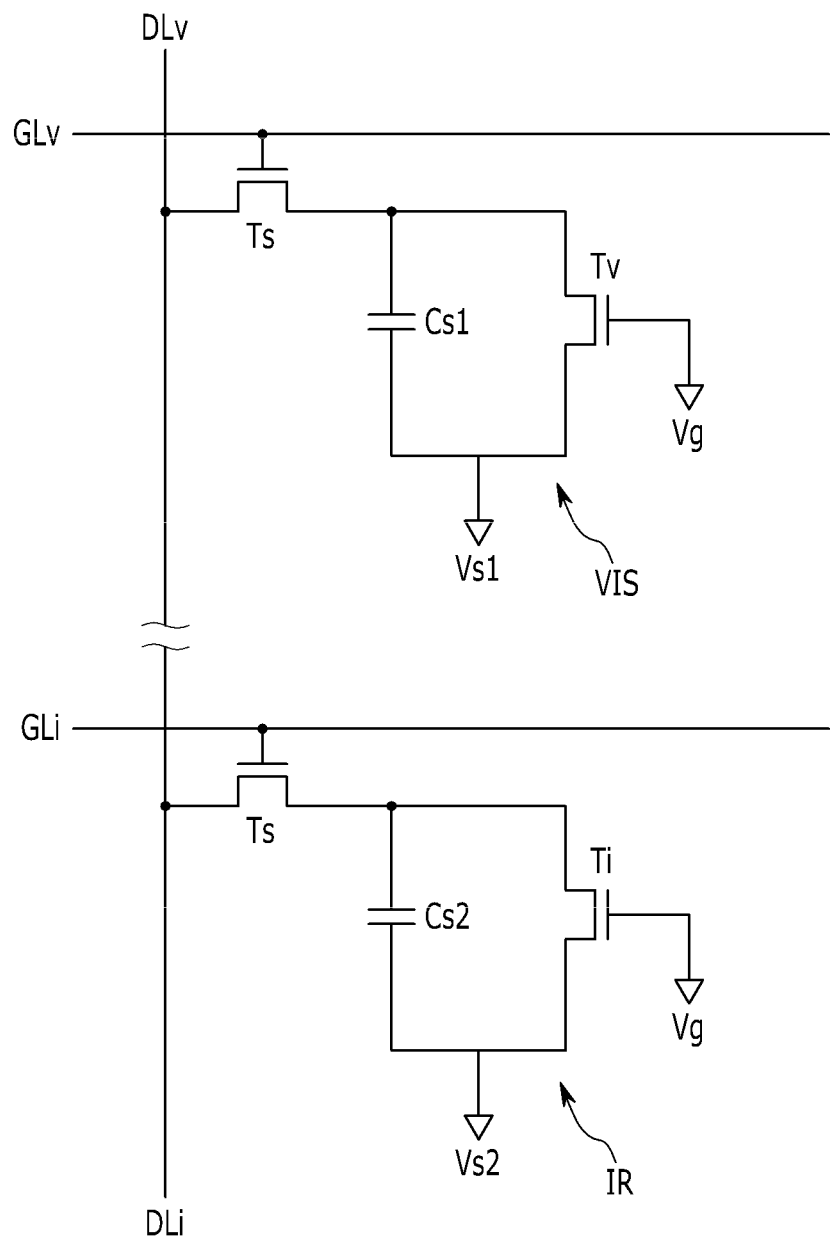
FIG. 1 is an equivalent circuit diagram of an optical sensor according to an exemplary embodiment.

Exemplary embodiments are described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. As disclosed here in, "at least one of" means at least one of the listed elements and may include any or all of the listed elements in any combination.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

An optical sensor according to an exemplary embodiment will be described in detail with reference to FIG. 1 and FIG. 2.

FIG. 1 is an equivalent circuit diagram of an optical sensor according to an exemplary embodiment. FIG. 2 is a graph showing an output curve of an optical sensor according to an exemplary embodiment.

The optical sensor includes a visible light sensor VIS and an infrared light sensor IR. The visible light sensor VIS senses visible light reflected from images, such as photographs or bar codes, to recognize the images. The infrared light sensor IR senses infrared light reflected by the contact of a tool, such as a finger, to recognize the contact. The optical sensor may be integrated on a top plate of the display. The display may be a liquid crystal display, an organic light emitting diode display, an electrophoretic display, and the like and is not particularly limited thereto. Further, the display may include at least one of an infrared light source and a visible light source.

Referring to FIG. 1, the visible light sensor VIS includes a visible light sensing transistor Tv. The visible light sensor VIS may also include a first capacitor Cs1.

An input terminal of the visible light sensing transistor Tv is connected to a first driving voltage Vs1, an output terminal of the visible light sensing transistor Tv is connected to an input terminal of a switching transistor Ts, and a control terminal of the visible light sensing transistor Tv is connected to a reference voltage Vg.

The input terminal of the switching transistor Ts is connected to the output terminal of the visible light sensing transistor Tv, an output terminal of the switching transistor Ts is connected to a visible light sensing data line DLv, and a control terminal of the switching transistor Ts is connected to a visible light sensing gate line GLv.

The terminals of the first capacitor Cs1 are connected to the input terminal and the output terminal of the visible light sensing transistor Tv.

The infrared light sensor IR includes an infrared light sensing transistor Ti. The infrared light sensor IR may also include a second capacitor Cs2.

An input terminal of the infrared light sensing transistor Ti is connected to a second driving voltage Vs2, an output terminal of the infrared light sensing transistor Ti is connected to the input terminal of a switching transistor Ts, and a control terminal of the infrared light sensing transistor Ti is connected to the reference voltage Vg.

The input terminal of the switching transistor Ts is connected to the output terminal of the infrared light sensing transistor Ti, the output terminal of the switching transistor Ts is connected to an infrared light sensing data line DLi, and the control terminal of the switching transistor Ts is connected to an infrared light sensing gate line GLi.

The terminals of the second capacitor Cs2 are connected to the input terminal and the output terminal of the infrared light sensing transistor Ti.

In exemplary embodiments, the visible light sensing gate line GLv and the infrared light sensing gate line GLi may use a common wire or use wires independent from each other.

The visible light sensing transistor Tv and the infrared light sensing transistor Ti independently receive the first driving voltage Vs1 and the second driving voltage Vs2, respectively. By way of example, the first driving voltage Vs1 and the second driving voltage Vs2 may be applied through different wires. By controlling the magnitudes of the first driving voltage Vs1 and the second driving voltage Vs2 the current flow through the visible light sensing transistor Tv and the infrared light sensing transistor Ti may be controlled without changing the areas of the visible light sensing transistor Tv and the infrared light sensing transistor Ti. In exemplary embodiments, the current flow through the visible light sensing transistor Tv and the infrared light sensing transistor Ti may be susbtantially the same.

In an exemplary embodiment, multiple visible light sensors VIS may be positioned around the infrared light sensor IR in all directions. Similarly, multiple infrared light sensors IR may be positioned around the visible light sensor VIS in all directions. Alternatively, the multiple visible light sensors VIS may be positioned vertically adjacent to each other and multiple infrared light sensors IR may be positioned vertically adjacent to each other. The relative position of multiple visible light sensor and multiple infrared light sensors may be varied randomly and is not intended to be limited to any particular arrangement.

Figure 2:
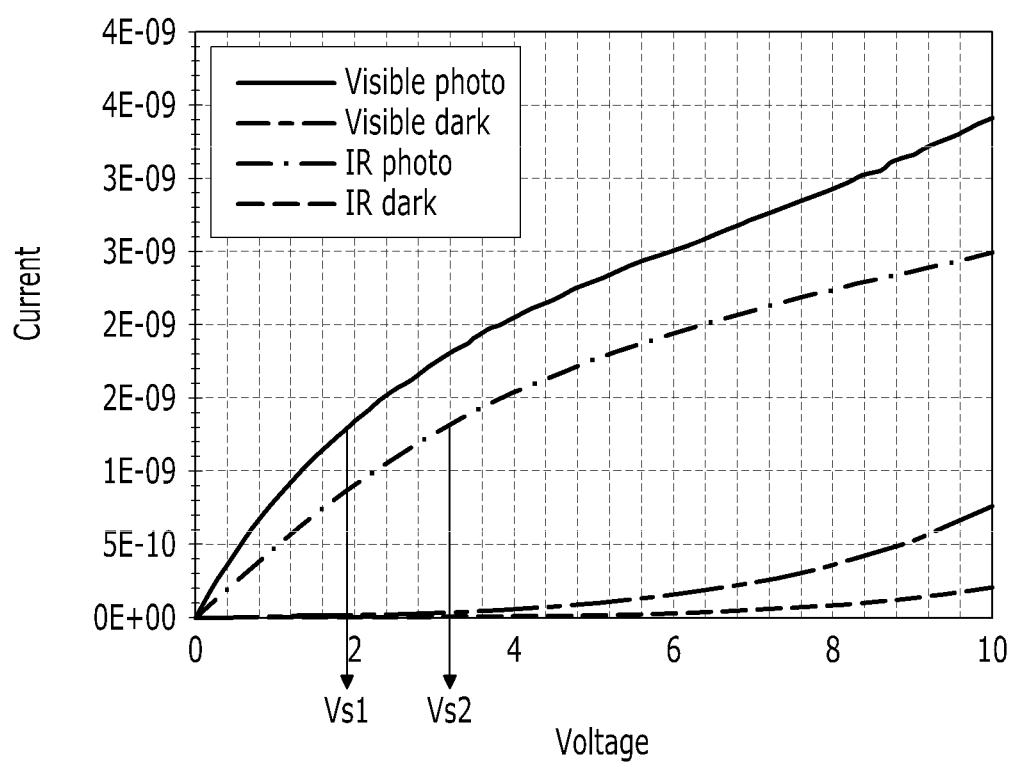
FIG. 2 is a graph showing an output curve of an optical sensor according to an exemplary embodiment.

Referring to FIG. 2, in a case in which visible light or infrared light is irradiated, for example a visible photo or a IR photo, and a case in which the visible light or infrared light is not irradiated, for example a visible dark or a IR dark, current-voltage characteristics of the visible light sensing transistor Tv and the infrared light sensing transistor Ti are shown. Hence, the visible light sensing transistor Tv and the infrared light sensing transistor Ti have different current-voltage characteristics from each other. Furthermore, since substantially the same photocurrent flows on the visible light sensing transistor Tv and the infrared light sensing transistor Ti, a sensing range of the visible light sensing transistor Tv and a sensing range of the infrared light sensing transistor Ti may be substantially the same, and finally, a common sensing range of the optical sensor may be substantially maximized.

In contrast, in the related art in which substantially the same driving voltage Vs is applied to a visible light sensing transistor Tv and a infrared light sensing transistor Ti through one common wire, since current characteristics of the visible light sensing transistor Tv and the infrared light sensing transistor Ti are different from each other, it may not be easy to control substantially the same photocurrent to flow on the visible light sensing transistor Tv and the infrared light sensing transistor Ti in spite of controlling the area of the visible light sensing transistor Tv and the area of the infrared light sensing transistor Ti. Further, since the sensing range of the visible light sensing transistor Tv and the sensing range of the infrared light sensing transistor Ti are different from each other when magnitudes of photocurrents flowing on the visible light sensing transistor Tv and the infrared light sensing transistor Ti are different from each other, the common sensing range of the optical sensor may be reduced.

Figure 10:
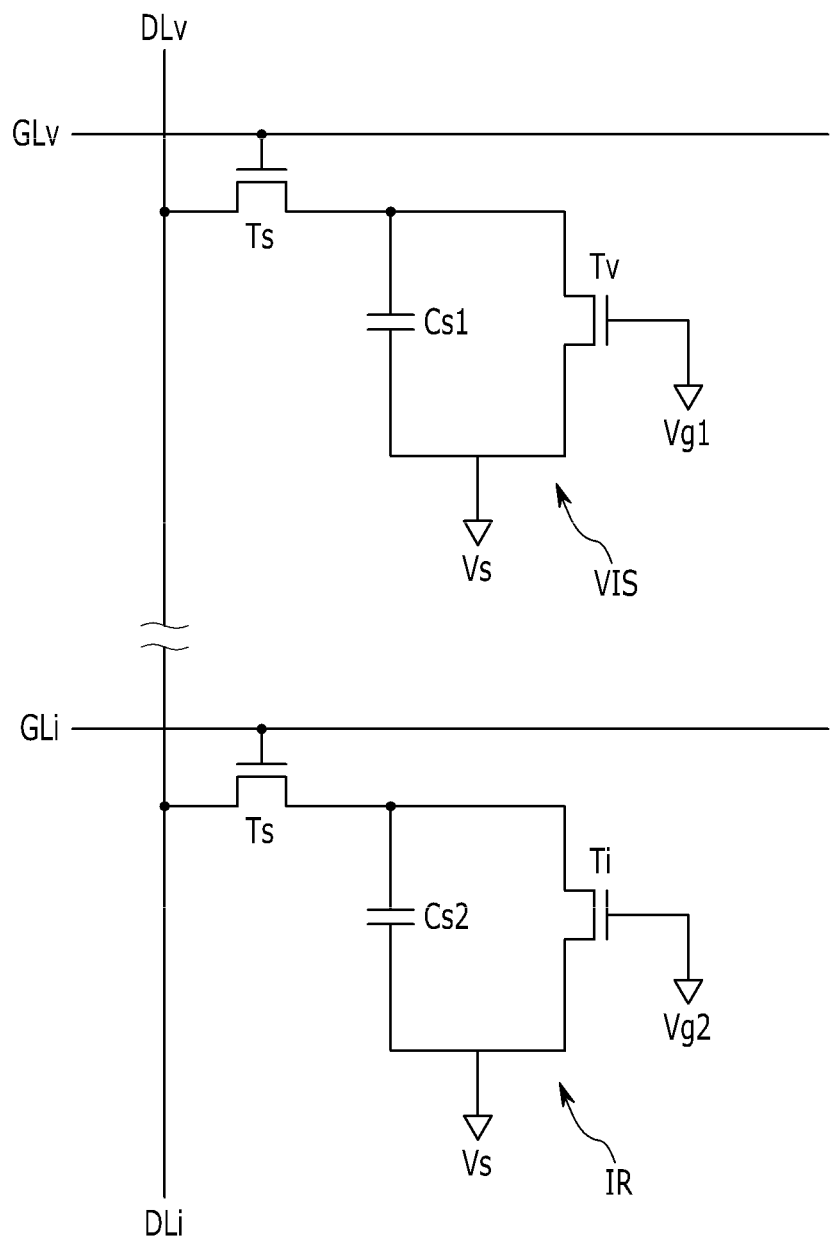
FIG. 10 is an equivalent circuit diagram of an optical sensor according to an exemplary embodiment.

FIG. 10 is an equivalent circuit diagram of an optical sensor according to an exemplary embodiment.

Referring to FIG. 10, in the optical sensor according to the exemplary embodiment of the present invention, the driving voltage Vs may be applied to the visible light sensing transistor Tv and the infrared light sensing transistor Ti through one common wire and the reference voltages Vg1 and Vg2 may be applied to the visible light sensing transistor Tv and the infrared light sensing transistor Ti, respectively, through different wires.

In exemplary embodiments, in the optical sensor the driving voltage may be applied to each of the visible light sensing transistor Tv and the infrared light sensing transistor Ti through different wires, and in addition, the reference voltage may be applied to each of the visible light sensing transistor Tv and the infrared light sensing transistor Ti through different wires.

A detailed structure of an optical sensor according to an exemplary embodiment of the present invention will be described in detail with reference to FIG. 3 to FIG. 5.

Figure 3:
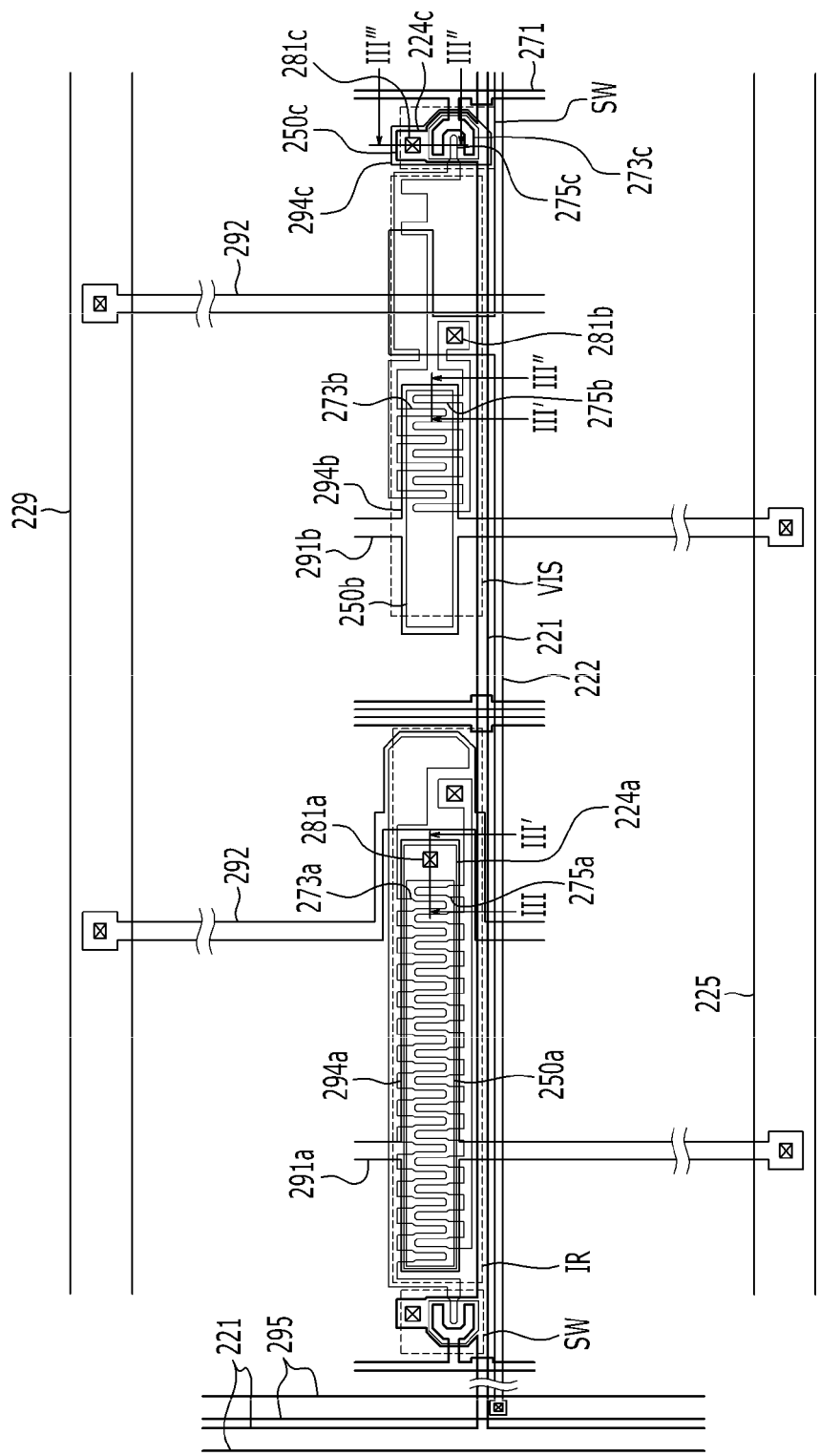
FIG. 3 is a layout view of an optical sensor according to an exemplary embodiment.

FIG. 3 is a layout view of an optical sensor according to an exemplary embodiment. FIG. 4 is a cross-sectional view of the optical sensor taken along line III-III' of FIG. 3. FIG. 5 is a cross-sectional view of an optical sensor according to an exemplary embodiment.

Referring to FIG. 3, the first driving voltage Vs1 and the second driving voltage Vs2 are applied through a first driving voltage line 295 and a second driving voltage line 229, respectively. The reference voltage Vg is applied through a reference voltage line 225 and the reference voltage line 225 is positioned on the same layer as a gate line 221 and a third lower gate electrode 224c. Multiple visible light sensors VIS may be positioned around the infrared light sensor IR in all directions and multiple infrared light sensors IR may be positioned around the visible light sensor VIS in all directions.

The first driving voltage Vs1 is applied sequentially to the first driving voltage line 295, a connecting member 222, and a second drain electrode 275b. The first driving voltage line 295 is connected to the connecting member 222 through a contact hole and the connecting member 222 is connected to the second drain electrode 275b through another contact hole. The first driving voltage line 295 is positioned on the same layer as a first upper gate electrode 294a, a second gate electrode 294b, and a third upper gate electrode 294c. The connecting member 222 is positioned on the same layer as the gate line 221 and the third lower gate electrode 224c. For example, the second drain electrode 275b is positioned on the connecting member 222 and the first driving voltage line 295 is positioned on the second drain electrode 275b. Two members positioned on different layers may be connected to each other through a contact hole. For example, the first upper gate electrode 294a and a first lower gate electrode 224a that are positioned on different layers and may be connected to each other through a first contact hole 281a.

The second driving voltage Vs2 is applied sequentially to the second driving voltage line 229, a connecting member 292, and a first drain electrode 275a. The second driving voltage line 229 is connected to the connecting member 292 through a contact hole and the connecting member 292 is connected to the first drain electrode 275a through another contact hole. The second driving voltage line 229 is positioned on the same layer as the gate line 221 and the third lower gate electrode 224c. The connecting member 292 is positioned on the same layer as the first upper gate electrode 294a, the second gate electrode 294b, and the third upper gate electrode 294c. For example, the first drain electrode 275a is positioned on the second driving voltage line 229 and the connecting member 292 is positioned on the first drain electrode 275a.

Figure 4:
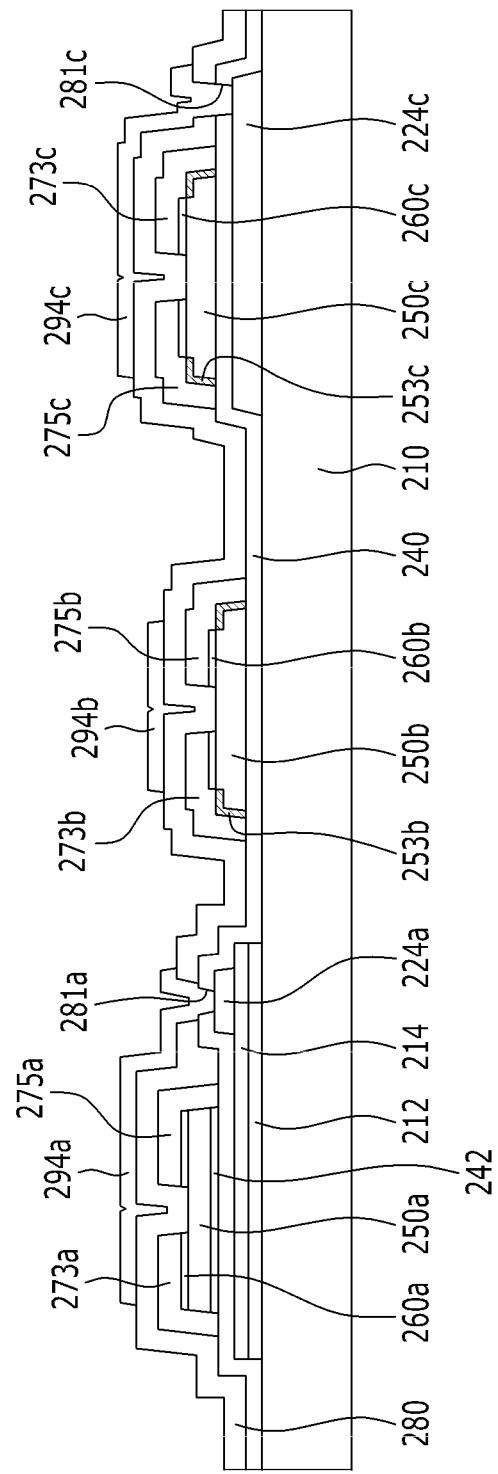
FIG. 4 is a cross-sectional view of the optical sensor taken along line III-III' of FIG. 3.

Referring to FIG. 3 and FIG. 4, a substrate 210 may be glass, plastic, and the like and may be transparent. The gate line 221 and a data line 271 that are insulated from each other while crossing each other are positioned on the substrate 210. A switching transistor SW is connected to the gate line 221 and the data line 271. The infrared light sensor IR and the visible light sensor VIS are connected to the switching transistor SW.

The gate line 221 and the data line 271 may define multiple pixels. One switching transistor SW and one infrared light sensor IR that are connected to each other may be positioned in one pixel. One switching transistor SW and one visible light sensor VIS that are connected to each other may be positioned in another adjacent pixel.

The infrared light sensor IR includes a first semiconductor layer 250a positioned on the substrate 210, a first ohmic contact layer 260a positioned on the first semiconductor layer 250a, a first source electrode 273a and a first drain electrode 275a positioned on the first ohmic contact layer 260a, a fourth insulating layer 280 positioned on the first source electrode 273a and the first drain electrode 275a, and a first upper gate electrode 294a positioned on the fourth insulating layer 280.

In an exemplary embodiment, the first semiconductor layer 250a may include amorphous silicon germanium (a-SiGe). Amorphous silicon germanium (a-SiGe) is a material having with quantum efficiency in an infrared light region. In exemplary embodiments, the first semiconductor layer 250a may include any material with high quantum efficiency in the infrared light region.

The first source electrode 273a and the first drain electrode 275a are separated from each other and a channel is positioned between the first source electrode 273a and the first drain electrode 275a. The first ohmic contact layer 260a is positioned on the first semiconductor layer 250a and may not be positioned in the channel portion.

Further, the infrared light sensor IR may include a first insulating layer 212 and a light blocking layer 214 that are positioned between the substrate 210 and the first semiconductor layer 250a. The infrared light sensor IR may include the first lower gate electrode 224a positioned on the light blocking member 214. The infrared light sensor IR may include a second insulating layer 240 positioned on the light blocking member 214 and the first lower gate electrode 224a. The infrared light sensor IR may include a third insulating layer 242 positioned on the second insulating layer 240.

The first insulating layer 212 may include silicon nitride (SiNx) and may improve adhesion between the substrate 210 and the light blocking member 214.

The light blocking member 214 may prevent visible light from being incident to the first semiconductor layer 250a. Since the first semiconductor layer 250a has high quantum efficiency in both the infrared light region and the visible light region, the light blocking member 214 may prevent the first semiconductor layer 250a included in the infrared light sensor IR from being influenced by visible light. In an exemplary embodiment, the light blocking member 214 may include amorphous germanium (a-Ge). Amorphous germanium (a-Ge) may allow the infrared light region to easily pass therethrough and may not allow the visible light region to pass therethrough. In an exemplary embodiment, the light blocking member 214 may include a compound of amorphous germanium. In addition, the light blocking member 214 may include any material that may allow the infrared light region to easily pass therethrough and may not allow the visible light region to easily pass therethrough.

The first lower gate electrode 224a is positioned on a portion of the light blocking member 214. A first contact hole 281a exposing the first lower gate electrode 224a is positioned on the second insulating layer 240 and the fourth insulating layer 280. The first upper gate electrode 294a is connected with the first lower gate electrode 224a through the first contact hole 281a. The first lower gate electrode 224a receives the same voltage as a voltage applied to the first upper gate electrode 294a to prevent the light blocking member 214 from being in a floating state.

In an exemplary embodiment, the third insulating layer 242 may include silicon nitride (SiNx). The third insulating layer 242 may improve the interface characteristic between the second insulating layer 240 and the first semiconductor layer 250a.

The visible light sensor VIS includes a second semiconductor layer 250b positioned on the substrate 210, a second semiconductor passivation layer 253b covering an upper surface and a side surface of an end of the second semiconductor layer 250b, a second ohmic contact layer 260b positioned on the second semiconductor layer 250b, a second source electrode 273b and a second drain electrode 275b positioned on the second ohmic contact layer 260b, a fourth insulating layer 280 positioned on the second source electrode 273b and the second drain electrode 275b, and a second gate electrode 294b positioned on the fourth insulating layer 280.

In an exemplary embodiment, the second semiconductor layer 250b may include amorphous silicon (a-Si). Amorphous silicon (a-Si) is a material with higher quantum efficiency in the visible light region than that in the infrared light region. In exemplary embodiments, the second semiconductor layer 250b may include any material having higher quantum efficiency in the visible light region than that in the infrared light region.

The second semiconductor passivation layer 253b may include silicon oxide (SiOx). The second semiconductor passivation layer 253b may be formed by performing plasma oxidation processing of the second semiconductor layer 250b. A side surface of the second semiconductor layer 250b may be protected from damage by the second semiconductor passivation layer 253b, which may be made of silicon oxide.

The second source electrode 273b and the second drain electrode 275b are positioned to be separated from each other and a channel is positioned between the second source electrode 273b and the second drain electrode 275b. The second ohmic contact layer 260b is positioned on the second semiconductor layer 250b and may not be positioned on the channel and the second semiconductor passivation layer 253b. A boundary line of the second semiconductor passivation layer 253b and a boundary line of the second ohmic contact layer 260b may coincide with each other.

The switching transistor SW includes a third semiconductor layer 250c positioned on the substrate 210, a third semiconductor passivation layer 253c covering an upper surface and a side surface of an end of the third semiconductor layer 250c, a third ohmic contact layer 260c positioned on the third semiconductor layer 250c, a third source electrode 273c and a third drain electrode 275c positioned on the third ohmic contact layer 260c, a fourth insulating layer 280 positioned on the third source electrode 273c and the third drain electrode 275c, and a third upper gate electrode 294c positioned on the fourth insulating layer 280.

In an exemplary embodiment, the third semiconductor layer 250c may include amorphous silicon (a-Si).

The third semiconductor passivation layer 253c may include silicon oxide (SiOx). The third semiconductor passivation layer 253c may be formed by performing a plasma oxidation processing of the third semiconductor layer 250c. A side surface of the third semiconductor layer 250c may be protected from damage by the third semiconductor passivation layer 253c, which may be made of silicon oxide.

The third source electrode 273c and the third drain electrode 275c are positioned to be separated from each other and a channel is positioned between the third source electrode 273c and the third drain electrode 275c. The third ohmic contact layer 260c is positioned on the third semiconductor layer 250c and may not be positioned on the channel and the third semiconductor passivation layer 253c. A boundary line of the third semiconductor passivation layer 253c and a boundary line of the third ohmic contact layer 260c may coincide with each other.

The third source electrode 273c is connected with the data line 271.

In an exemplary embodiment, the switching transistor SW may include a third lower gate electrode 224c positioned between the substrate 210 and the third semiconductor layer 250c. The switching transistor SW may include the second insulating layer 240 positioned on the third lower gate electrode 224c.

A third contact hole 281c exposing the third lower gate electrode 224c is positioned on the second insulating layer 240 and the fourth insulating layer 280. The third upper gate electrode 294c is connected with the third lower gate electrode 224c through the third contact hole 281c.

Figure 5:
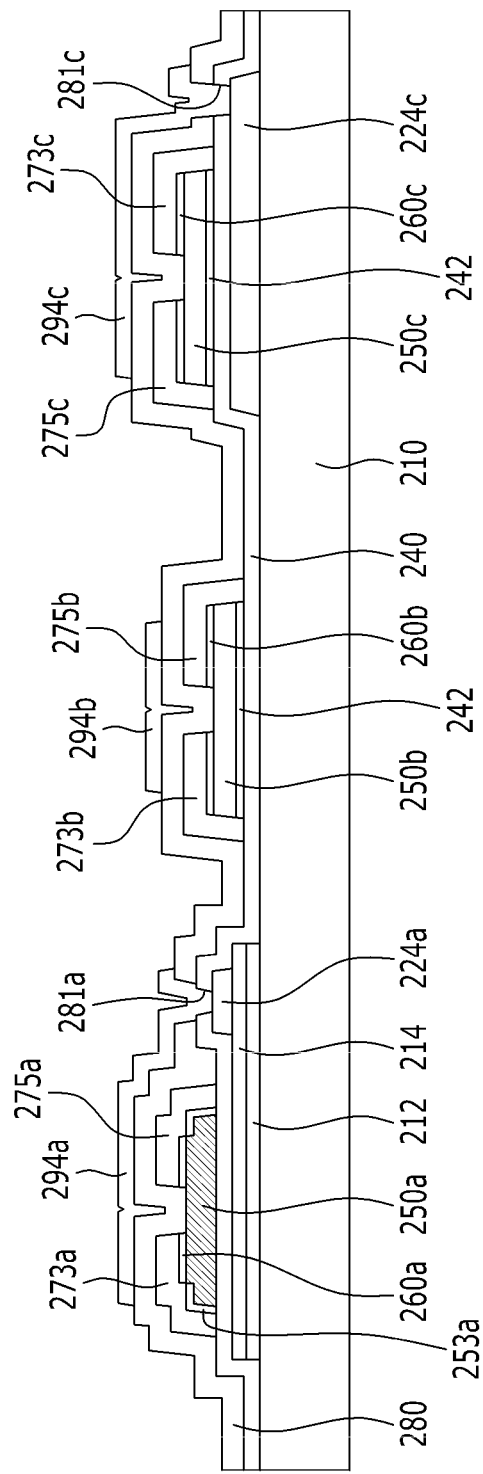
FIG. 5 is a cross-sectional view of an optical sensor according to an exemplary embodiment.

Referring to FIG. 5, the infrared light sensor IR includes a first semiconductor passivation layer 253a covering an upper surface and a side surface of the ends of the first semiconductor layer 250a. The first semiconductor passivation layer 253a may be made of silicon germanium oxide (SiGeOx). The first semiconductor passivation layer 253a may be formed by performing a plasma oxidation processing of the first semiconductor layer 250a. A boundary line of the first semiconductor passivation layer 253a and a boundary line of the first ohmic contact layer 260a may coincide with each other.

The visible light sensor VIS may include a third insulating layer 242 positioned on the second insulating layer 240. The switching transistor SW may include a third insulating layer 242 positioned on the second insulating layer 240.

Figure 6:
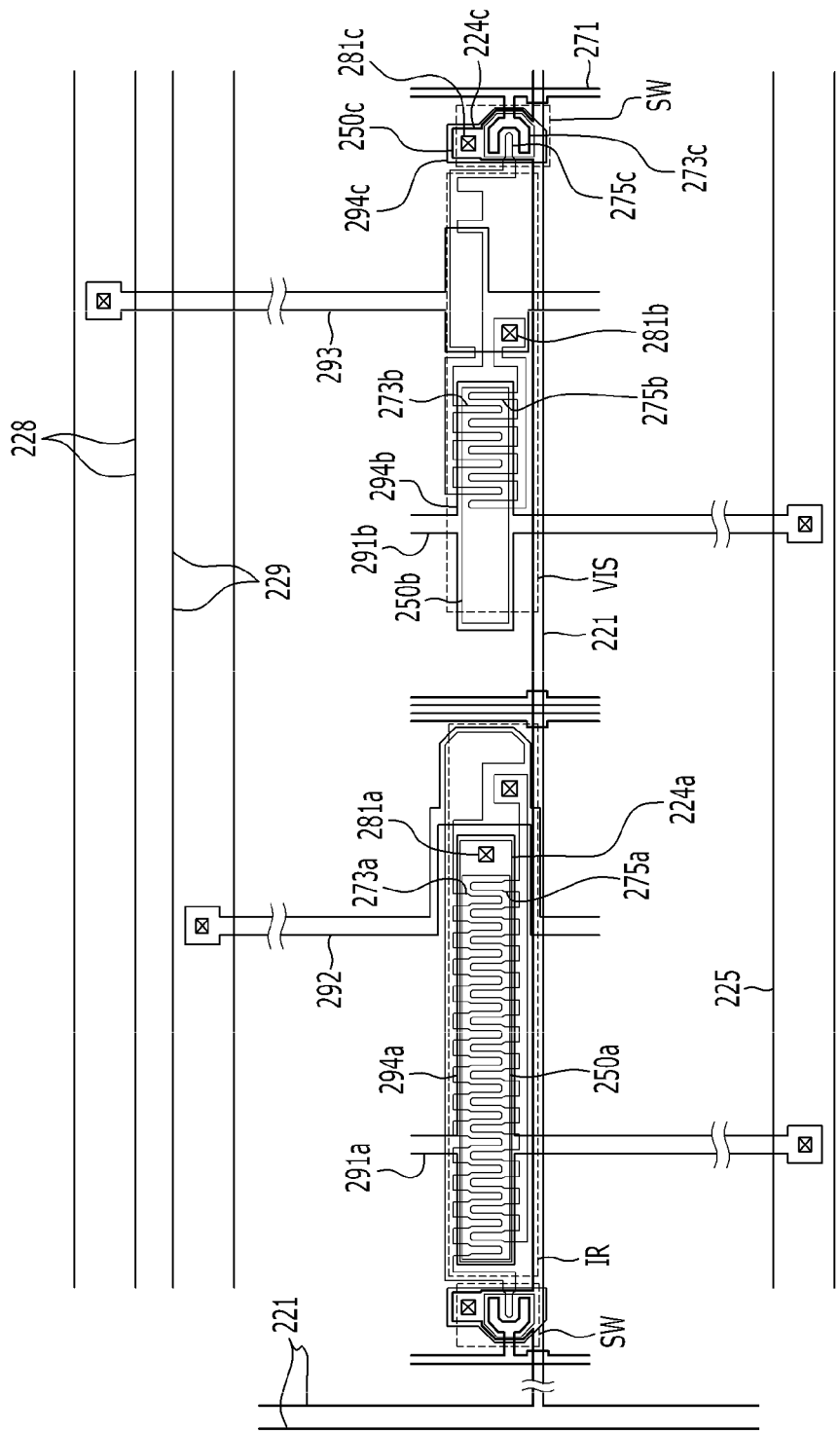
FIG. 6 is a layout view of an optical sensor according to an exemplary embodiment.

FIG. 6 is a layout view of an optical sensor according to yet another exemplary embodiment.

Referring to FIG. 6, the first driving voltage Vs1 and the second driving voltage Vs2 are applied through the first driving voltage line 228 and the second driving voltage line 229, respectively. The first driving voltage line 228 and the second driving voltage line 229 are both positioned on the same layer as the gate line 221 and the third lower gate electrode 224c. In FIG. 6, multiple visible light sensors VIS may be positioned vertically adjacent to each other and multiple infrared light sensors IR may be positioned vertically adjacent to each other.

The first driving voltage Vs1 is applied sequentially to the first driving voltage line 228, a connecting member 293, and a second drain electrode 275b. The first driving voltage line 228 is connected to the connecting member 293 through a contact hole and the connecting member 293 is connected to the second drain electrode 275b through another contact hole.

The first driving voltage line 228 is positioned at the same layer as the gate line 221 and the third lower gate electrode 224c. The connecting member 293 is positioned at the same layer as the first upper gate electrode 294a, the second gate electrode 294b, and the third upper gate electrode 294c. By way of example, the second drain electrode 275b is positioned on the first driving voltage line 228 and the connecting member 293 is positioned on the second drain electrode 275b.

The second driving voltage Vs2 is applied sequentially to the second driving voltage line 229, a connecting member 292, and a first drain electrode 275a. The second driving voltage line 229 is connected to the connecting member 292 through a contact hole and the connecting member 292 is connected to the first drain electrode 275a through another contact hole. The second driving voltage line 229 is positioned at the same layer as the gate line 221 and the third lower gate electrode 224c. The connecting member 292 is positioned at the same layer as the first upper gate electrode 294a, the second gate electrode 294b, and the third upper gate electrode 294c. By way of example, the first drain electrode 275a is positioned on the second driving voltage line 229 and the connecting member 292 is positioned on the first drain electrode 275a.

Figure 7:
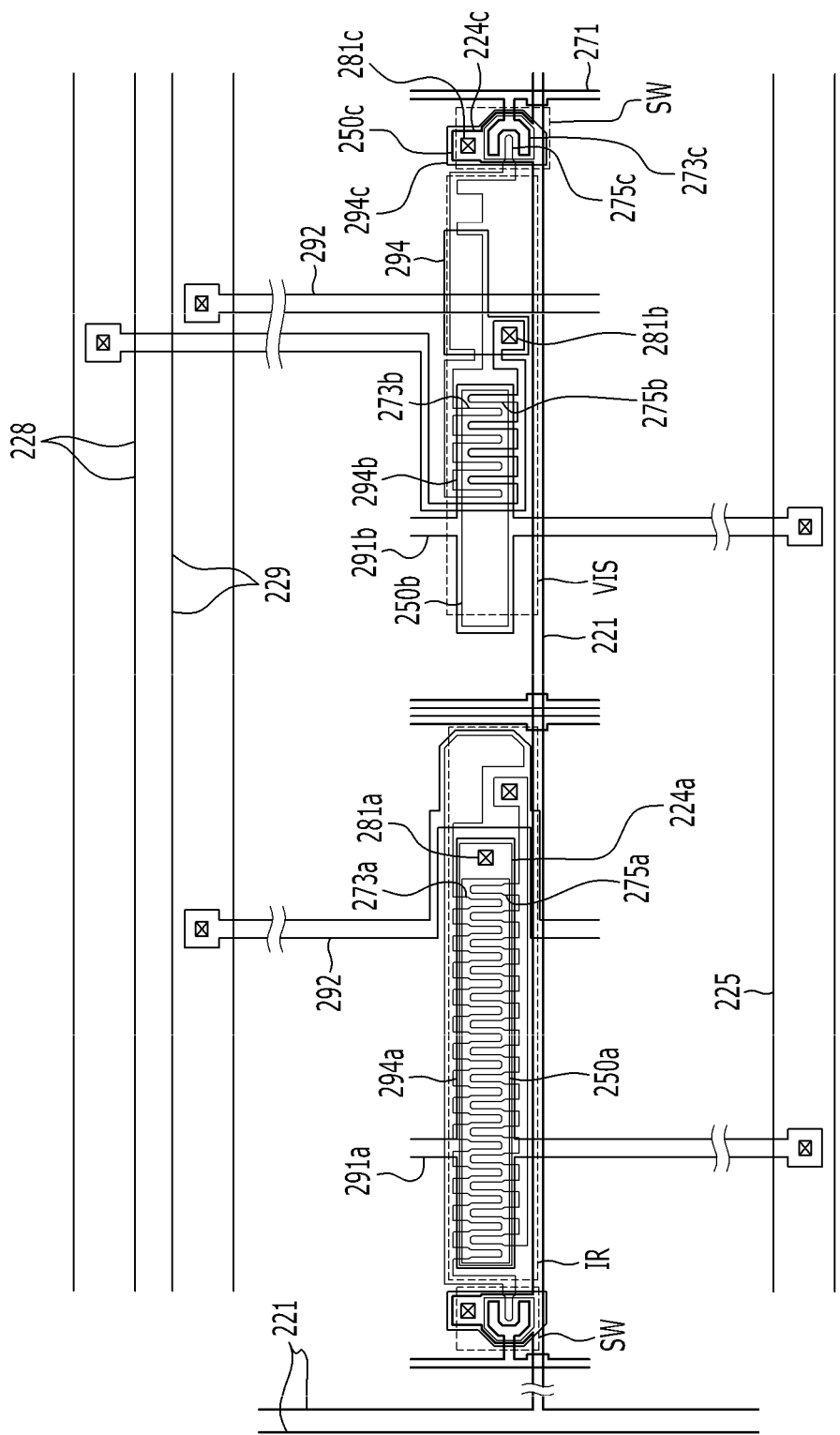
FIG. 7 is a layout view of an optical sensor according to an exemplary embodiment.

FIG. 7 is a layout view of an optical sensor according to an exemplary embodiment.

Referring to FIG. 7, the first driving voltage Vs1 and the second driving voltage Vs2 are applied through the first driving voltage line 228 and the second driving voltage line 229, respectively. The first driving voltage line 228 and the second driving voltage line 229 are both positioned at the same layer as the gate line 221 and the third lower gate electrode 224c. Multiple visible light sensors VIS may be positioned around the infrared light sensor IR in all directions and multiple infrared light sensors IR may be positioned around the visible light sensor VIS in all directions.

The first driving voltage Vs1 is applied sequentially to the first driving voltage line 228, the second drain electrode 275b, and a connecting member 294. The first driving voltage line 228 is connected to the second drain electrode 275b through the contact hole and the second drain electrode 275b is connected to a connecting member 294 through another contact hole. The first driving voltage line 228 is positioned at the same layer as the gate line 221 and the third lower gate electrode 224c. The connecting member 294 is positioned at the same layer as the first upper gate electrode 294a, the second gate electrode 294b, and the third upper gate electrode 294c. By way of example, the second drain electrode 275b is positioned on the first driving voltage line 228 and the connecting member 294 is positioned on the second drain electrode 275b.

The second driving voltage Vs2 is applied sequentially to the second driving voltage line 229, a connecting member 292, and a first drain electrode 275a. The second driving voltage line 229 is connected to the connecting member 292 through a contact hole and the connecting member 292 is connected to the first drain electrode 275a through another contact hole. The second driving voltage line 229 is positioned at the same layer as the gate line 221 and the third lower gate electrode 224c. The connecting member 292 is positioned at the same layer as the first upper gate electrode 294a, the second gate electrode 294b, and the third upper gate electrode 294c. By way of example, the first drain electrode 275a is positioned on the second driving voltage line 229 and the connecting member 292 is positioned on the first drain electrode 275a.

Figure 8:
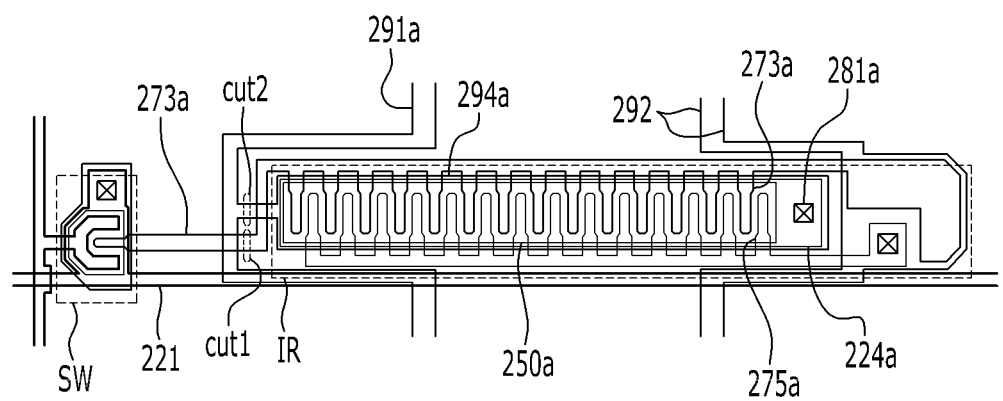
FIG. 8 is a layout view of an optical sensor according to an exemplary embodiment.

FIG. 8 is a layout view of an optical sensor according to an exemplary embodiment.

Referring to FIG. 8, an upper gate line 291a includes a concave portion, a connection portion, and an upper gate electrode 294a, the concave portion surrounds the upper gate electrode 294a, and the concave portion and the upper gate electrode 294a are connected to each other by a connection portion. By way of example, the concave portion and the upper gate electrode 294a are not superimposed on each other. If a short occurs between the upper gate electrode 294a and the first source electrode 273a or a short occurs between the upper gate electrode 294a and the first drain electrode 275a, then the connection portion is cut by laser (cut2) and the first source electrode 273a is cut (cut1), thereby repairing the optical sensor. In other words, although the connection portion is cut, current continuously flows through the upper gate line 291a, and as a result, additional sensors (not shown) positioned in the data line direction of the sensor shown in FIG. 8 continue to operate normally.

If a short occurs between the first source electrode 273a and the first drain electrode 275a, then the first source electrode 273a is cut (cut1) to repair the optical sensor. Thus, additional sensors (not shown) positioned in the data line direction of the sensor shown in FIG. 8 continue to operate normally.

In exemplary embodiments, the description of FIG. 8 may be applied to the gate line 291b, the second source electrode 273b, and the second drain electrode 275b of the visible light sensor VIS (not shown).

Figure 9:
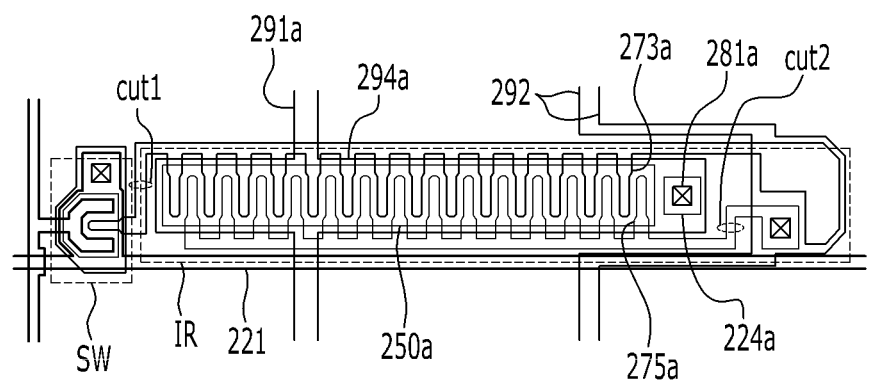
FIG. 9 is a layout view of an optical sensor according to an exemplary embodiment.

FIG. 9 is a layout view of an optical sensor according to an exemplary embodiment.

Referring to FIG. 9, the first drain electrode 275a includes an extended portion and the extended portion is not superimposed on the connecting member 292 to which the second driving voltage Vs2 is applied. If a short occurs between the upper gate electrode 294a and the first source electrode 273a or a short occurs between the upper gate electrode 294a and the first drain electrode 275a, then the extended portion is cut by laser (cut2) and the first source electrode 273a is cut (cut1), thereby repairing the optical sensor. In other words, although the extended portion is cut, the connecting member 292 continuously receives the second driving voltage Vs2, and as a result, additional sensors (not shown) positioned in the data line direction of the sensor shown in FIG. 9 continue to operate normally.

If a short occurs between the first source electrode 273a and the first drain electrode 275a, then the first source electrode 273a is cut (cut1) to repair the optical sensor. In other words, additional sensors (not shown) positioned in the data line direction of the sensor shown in FIG. 8 continue to operate normally.

In exemplary embodiments, the description of FIG. 9 may be applied to the second drain electrode 275b of the visible light sensor VIS (not shown).

According to the exemplary embodiments of the present invention, it is possible to allow the same magnitude of current to flow through a visible light sensing transistor and an infrared light sensing transistor regardless of areas of the transistors, maximize a sensing range of an optical sensor, and easily repair a short of the optical sensor.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. An optical sensor, comprising:
a visible light sensor comprising a visible light sensing transistor; and
an infrared light sensor comprising an infrared light sensing transistor,
wherein the visible light sensing transistor is configured to receive a first driving voltage through a first driving voltage line, the infrared light sensing transistor is configured to receive a second driving voltage through a second driving voltage line, and the visible light sensing transistor and the infrared light sensing transistor are both configured to receive a reference voltage through a reference voltage line.

2. The optical sensor of claim 1, further comprising:
a first switching transistor connected to the visible light sensing transistor; and
a second switching transistor connected to the infrared light sensing transistor,
wherein an output terminal of the visible light sensing transistor is connected to an input terminal of the first switching transistor, and
an output terminal of the infrared light sensing transistor is connected to an input terminal of the second switching transistor.

3. The optical sensor of claim 2, wherein:
the first switching transistor is connected to a visible light sensing data line, and the second switching transistor is connected to an infrared light sensing data line.

4. The optical sensor of claim 3, wherein:
the first switching transistor is connected to a visible light sensing gate line, and the second switching transistor is connected to an infrared light sensing gate line.

5. The optical sensor of claim 1, wherein:
the visible light sensor comprises a first capacitor wherein a first terminal of the first capacitor is connected to an input terminal of the visible light sensing transistor, and a second terminal of the first capacitor is connected to an output terminal of the visible light sensing transistor, and
the infrared light sensor comprises a second capacitor wherein a first terminal of the second capacitor is connected to an input terminal of the infrared light sensing transistor, and a second terminal of the second capacitor is connected to an output terminal of the infrared light sensing transistor.

6. The optical sensor of claim 1, wherein:
the first driving voltage line and the second driving voltage line are disposed at different layers from each other.

7. The optical sensor of claim 6, further comprising:
a first connecting member disposed below the first driving voltage line and connected to the first driving voltage line through a first contact hole, the first connecting member being connected to the visible light sensing transistor through a second contact hole.

8. The optical sensor of claim 1, wherein:
the first driving voltage line is disposed at the same layer as the second driving voltage line.

9. The optical sensor of claim 8, further comprising:
a second connecting member disposed on the first driving voltage line and connected to the first driving voltage line through a contact hole, the second connecting member being connected to the visible light sensing transistor through the contact hole.

10. The optical sensor of claim 8, wherein:
the first driving voltage line is connected to the visible light sensing transistor through a contact hole.

11. The optical sensor of claim 1, further comprising:
an upper gate line connected to the reference voltage line, the upper gate line comprising a concave portion, a connection portion, and an upper gate electrode.

12. The optical sensor of claim 11, wherein:
the concave portion and the upper gate electrode are connected to each other by the connection portion, and the concave portion surrounds the upper gate electrode.

13. The optical sensor of claim 1, wherein:
the visible light sensing transistor comprises an input electrode comprising a first extended portion and the infrared light sensing transistor comprises an input electrode comprising a second extended portion.

14. An optical sensor, comprising:
a visible light sensor comprising a visible light sensing transistor; and
an infrared light sensor comprising an infrared light sensing transistor,
wherein the visible light sensing transistor and the infrared light sensing transistor are both configured to receive driving voltages through a driving voltage line, the visible light sensing transistor is configured to receive a first reference voltage through a first reference voltage line, and the infrared light sensing transistor is configured to receive a second reference voltage through a second reference voltage line.

15. The optical sensor of claim 14, further comprising:
a first switching transistor connected to the visible light sensing transistor; and
a second switching transistor connected to the infrared light sensing transistor,
wherein an output terminal of the visible light sensing transistor is connected to an input terminal of the first switching transistor, and
an output terminal of the infrared light sensing transistor is connected to an input terminal of the second switching transistor.

16. The optical sensor of claim 15, wherein:
the first switching transistor is connected to a visible light sensing data line, and the second switching transistor is connected to an infrared light sensing data line.

17. The optical sensor of claim 16, wherein:
the first switching transistor is connected to a visible light sensing gate line, and the second switching transistor is connected to an infrared light sensing gate line.

18. The optical sensor of claim 14, wherein:
the visible light sensor comprises a first capacitor wherein a first terminal of the first capacitor is connected to an input terminal of the visible light sensing transistor and a second terminal of the first capacitor is connected to an output terminal of the visible light sensing transistor, and
the infrared light sensor comprises a second capacitor wherein a first terminal of the second capacitor is connected to an input terminal of the infrared light sensing transistor, and wherein a second terminal of the second capacitor is connected to an output terminal of the infrared light sensing transistor.

19. An optical sensor, comprising
a plurality of visible light sensors each comprising a plurality of visible light sensing transistor; and
a plurality of infrared light sensors each comprising a plurality of infrared light sensing transistors,
wherein the plurality of visible light sensing transistors and the plurality of infrared light sensing transistors are configured to receive driving voltages through a driving voltage line, the plurality of visible light sensing transistors are configured to receive a first reference voltage through a first reference voltage line, and the plurality of infrared light sensing transistors are configured to receive a second reference voltage through a second reference voltage line, wherein the plurality of visible light sensing sensor are arranged such that each individual visible light sensing sensor may be electrically isolated from the first reference voltage line such that the remaining visible light sensing sensors remain electrically connected to the first reference voltage line, and wherein the plurality of infrared light sensing sensors are arranged such that each individual infrared light sensing sensor may be electrically isolated from the second reference voltage line such that the remaining infrared light sensing sensors remain electrically connected to the second reference voltage line.

20. The optical sensor of claim 19, wherein:
the first driving voltage line and the second driving voltage line are disposed at different layers from each other.

21. The optical sensor of claim 19, wherein:
the first driving voltage line is disposed at the same layer as the second driving voltage line.

* * * * *